United States Patent
Zeng et al.

(10) Patent No.: US 11,114,639 B2
(45) Date of Patent: Sep. 7, 2021

(54) FLEXIBLE DISPLAY PANEL, FABRICATING METHOD THEREOF AND DISPLAY APPARATUS

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Suwei Zeng, Beijing (CN); Jie Pan, Beijing (CN)

(73) Assignees: HEFEIXINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 95 days.

(21) Appl. No.: 16/466,241

(22) PCT Filed: Dec. 11, 2018

(86) PCT No.: PCT/CN2018/120245
§ 371 (c)(1),
(2) Date: Jun. 3, 2019

(87) PCT Pub. No.: WO2019/137133
PCT Pub. Date: Jul. 18, 2019

(65) Prior Publication Data
US 2020/0343475 A1  Oct. 29, 2020

(30) Foreign Application Priority Data
Jan. 15, 2018 (CN) .......................... 201810036574.2

(51) Int. Cl.
*H01L 51/52* (2006.01)
*H01L 51/00* (2006.01)
(Continued)

(52) U.S. Cl.
CPC ...... *H01L 51/5237* (2013.01); *H01L 51/0097* (2013.01); *H01L 51/5056* (2013.01);
(Continued)

(58) Field of Classification Search
CPC ............. H01L 51/5237; H01L 51/0097; H01L 2251/5338; H01L 51/5056; H01L 51/5072; H01L 51/5092
See application file for complete search history.

(56) References Cited

U.S. PATENT DOCUMENTS

2014/0204509 A1  7/2014  Park
2019/0213978 A1  7/2019  Jia

FOREIGN PATENT DOCUMENTS

CN  106773445 A  5/2017
CN  106910432 A  6/2017
(Continued)

OTHER PUBLICATIONS

International Search Report and Written Opinion of the International Searching Authority (with English language translation), International Application No. PCT/CN2018/120245, dated Mar. 7, 2019, 12 pp.

*Primary Examiner* — Anthony Ho
(74) *Attorney, Agent, or Firm* — Myers Bigel, P.A.

(57) ABSTRACT

The present disclosure provides a flexible OLED display panel, a fabricating method thereof and a display apparatus. The flexible display panel includes a light emitting display unit including a display light emitting device, and a controllable deformation unit including a control light emitting device and a photo-deformable layer disposed in a light emitting direction of the control light emitting device, the photo-deformable layer configured to deform under illumination of the control light emitting device. An optical path of the control light emitting device and an optical path of the display light emitting device do not coincide with each other.

(Continued)

Since the optical path of the control light emitting device and the optical path of the display light emitting device do not coincide with each other, crosstalk between display light and control light is prevented, and the display quality is improved.

20 Claims, 6 Drawing Sheets

(51) Int. Cl.
*H01L 51/50* (2006.01)
*H01L 51/56* (2006.01)

(52) U.S. Cl.
CPC ...... *H01L 51/5072* (2013.01); *H01L 51/5092* (2013.01); *H01L 51/5206* (2013.01); *H01L 51/5221* (2013.01); *H01L 51/56* (2013.01); *H01L 2251/5338* (2013.01)

(56) References Cited

FOREIGN PATENT DOCUMENTS

| | | |
|---|---|---|
| CN | 107168591 A | 9/2017 |
| CN | 107291245 A | 10/2017 |
| CN | 108258019 A | 7/2018 |

FLEXIBLE DISPLAY PANEL, FABRICATING METHOD THEREOF AND DISPLAY APPARATUS

RELATED APPLICATION

The present application is a 35 U.S.C. 371 national stage application of PCT International Application No. PCT/CN2018/120245, filed on Dec. 11, 2018, which claims the benefit of Chinese Patent Application No. 201810036574.2, filed on Jan. 15, 2018, the entire disclosures of which are incorporated herein by reference.

TECHNICAL FIELD

The present disclosure relates to the display technology, in particular to the OLED display technology, especially a flexible OLED display device and a fabricating method thereof.

BACKGROUND

Active matrix/organic light emitting diode (AMOLED) is gradually expanding its market in mobile phone screens and TV panels due to its high contrast, rapid response, high color intensity, light weight and flexibility. It is considered as the next generation display technology most likely to replace LCD.

SUMMARY

According to an aspect of the present disclosure, a flexible display panel is provided. The flexible display panel includes: a light emitting display unit including a display light emitting device; and a controllable deformation unit including a control light emitting device and a photo-deformable layer disposed in a light emitting direction of the control light emitting device, the photo-deformable layer being capable of deforming under illumination of the control light emitting device. An optical path of the control light emitting device and an optical path of the display light emitting device do not coincide with each other.

In some embodiments, the flexible display panel further includes an encapsulation layer disposed between the light emitting display unit and the controllable deformation unit. The display light emitting device includes: a first transparent flexible substrate; a first reflective cathode, a display light emitting layer and a first transparent anode disposed in sequence between the first transparent flexible substrate and the encapsulation layer along a light emitting direction of display light. The control light emitting device includes: a second transparent flexible substrate; a second reflective cathode, a control light emitting layer and a second transparent anode disposed in sequence between the second transparent flexible substrate and the encapsulation layer along a light emitting direction of control light. The first reflective cathode and the second reflective cathode share the encapsulation layer for encapsulation connection.

In some embodiments, the flexible display panel further includes a transparent flexible substrate and an encapsulation layer. The display light emitting device includes a first reflective cathode, a display light emitting layer and a first transparent anode disposed in sequence between the transparent flexible substrate and the encapsulation layer along a light emitting direction of display light. The control light emitting device includes a second reflective cathode, a control light emitting layer and a second transparent anode disposed in sequence between the transparent flexible substrate and the encapsulation layer along a light exiting direction of control light. The light emitting display units and the controllable deformation units are arranged in an array and share the transparent flexible substrate and the encapsulation layer. The first transparent anode and the second reflective cathode are located in a same layer. The display light emitting layer and the control light emitting layer are located in a same layer. The first reflective cathode and the second transparent anode are located in a same layer.

In some embodiments, the flexible display panel further includes a transparent flexible substrate and an encapsulation layer. The display light emitting device includes a first reflective cathode, a display light emitting layer and a first transparent anode disposed in sequence between the transparent flexible substrate and the encapsulation layer along a light emitting direction of display light. The control light emitting device includes a second reflective cathode, a control light emitting layer and a second transparent anode disposed in sequence between the transparent flexible substrate and the encapsulation layer along a light emitting direction of control light. The light emitting display units and the controllable deformation units are arranged in an array and share the transparent flexible substrate and the encapsulation layer. The first transparent anode and the second transparent anode are located in a same layer. The display light emitting layer and the control light emitting layer are located in a same layer. The first reflective cathode and the second reflective cathode are located in a same layer.

In some embodiments, the display light emitting layer includes a red light emitting layer, a green light emitting layer and a blue light emitting layer arranged in sequence. The control light emitting layer includes a blue light emitting layer.

In some embodiments, any one of the red light emitting layer, the green light emitting layer and the blue light emitting layer includes at least one or more of a hole injection layer HIL, a hole transport layer HTL, a light emitting layer EML, an electron transport layer ETL, and an electron injection layer EIL.

In some embodiments, the photo-deformable layer is a high cross-linked LCE film containing azobenzene.

In some embodiments, the photo-deformable layer includes patterns of a photo-deformable material arranged in an array; a shape of each pattern of the photo-deformable material is a strip, a grid or a plane.

According to another aspect of the present disclosure, a method for fabricating a flexible display panel is provided. The method includes: forming a light emitting display unit including a display light emitting device; and forming a controllable deformation unit including a control light emitting device and a photo-deformable layer disposed in a light emitting direction of the control light emitting device, the photo-deformable layer being capable of deforming under illumination of the control light emitting device. An optical path of the control light emitting device and an optical path of the display light emitting device do not coincide with each other.

In some embodiments, the step of forming the light emitting display unit includes: forming a first transparent anode on a first transparent flexible substrate; forming a display light emitting layer on the first transparent anode; and forming a first reflective cathode on the display light emitting layer. The step of forming the controllable deformation unit includes: forming a second transparent anode on a second transparent flexible substrate; forming a control light emitting layer on the second transparent anode; forming a second reflective cathode on the control light emitting layer; and forming a photo-deformable layer on a side of the second transparent flexible substrate facing away from the control light emitting layer. The method further includes: forming an encapsulation layer on the first reflective cathode or the second reflective cathode; and encapsulating the light emitting display unit and the controllable deformation unit by the encapsulation layer.

According to yet another aspect of the present disclosure, a method for fabricating a flexible display panel is provided. The method includes: providing a transparent flexible substrate; forming a light emitting display unit and a controllable deformation unit on a same side of the transparent flexible substrate; the light emitting display unit including a display light emitting device; the controllable deformation unit including a control light emitting device and a photo-deformable layer disposed in a light emitting direction of the control light emitting device, the photo-deformable layer being capable of deforming under illumination of the control light emitting device. An optical path of the control light emitting device and an optical path of the display light emitting device do not coincide with each other.

In some embodiments, the step of forming the light emitting display unit and the controllable deformation unit on the transparent flexible substrate includes: forming a first transparent anode of the light emitting display unit and a second reflective cathode of the controllable deformation unit on a same side of the transparent flexible substrate, the first transparent anode and the second reflective cathode being located in a same layer; forming a display light emitting layer of the light emitting display unit on the first transparent anode, forming a control light emitting layer of the controllable deformation unit on the second reflective cathode, the display light emitting layer and the control light emitting layer being located in a same layer; forming a first reflective cathode of the light emitting display unit on the display light emitting layer, forming a second transparent anode of the controllable deformation unit on the control light emitting layer, the first reflective cathode and the second transparent anode being located in a same layer; forming an encapsulation layer on the first reflective cathode and the second transparent anode; and forming a photo-deformable layer on the encapsulation layer.

In some embodiments, the step of forming a light emitting display unit for realizing a display function and forming a controllable deformation unit for deforming by illumination on the transparent flexible substrate includes: forming a first transparent anode of the light emitting display unit and a second transparent anode of the controllable deformation unit on a same side of the transparent flexible substrate, the first transparent anode and the second transparent anode being located in a same layer; forming a display light emitting layer of the light emitting display unit on the first transparent anode, forming a control light emitting layer of the controllable deformation unit on the second transparent anode, the display light emitting layer and the control light emitting layer being located in a same layer; forming a first reflective cathode of the light emitting display unit on the display light emitting layer, forming a second reflective cathode of the controllable deformation unit on the control light emitting layer, the first reflective cathode and the second reflective cathode being located in a same layer; forming an encapsulation layer on the first reflective cathode and the second reflective cathode; and forming a photo-deformable layer on the transparent flexible substrate.

In some embodiments, the method further includes disposing a light shielding layer on a side of the photo-deformable layer facing away from the transparent flexible substrate.

According to still another aspect of the present disclosure, a flexible display apparatus is provided. The flexible display apparatus includes a flexible display panel as described in the above embodiments.

BRIEF DESCRIPTION OF THE DRAWINGS

In order to more clearly illustrate the technical solutions in embodiments of the disclosure or in the prior art, the appended drawings needed to be used in the description of the embodiments or the prior art will be introduced briefly in the following. Obviously, the drawings in the following description are only some embodiments of the disclosure, and for those of ordinary skills in the art, other drawings may be obtained according to these drawings under the premise of not paying out creative work.

DETAILED DESCRIPTION OF THE DISCLOSURE

The present application will be further described in detail below with reference to the accompanying drawings and embodiments. It is understood that the specific embodiments described herein are only used for explanations rather than limitations to the present disclosure. It should also be noted that, for the convenience of description, only parts related to the disclosure are shown in the drawings.

It should be noted that the embodiments in the present application and the features in the embodiments may be combined with each other without conflict. The present application will be described in detail below with reference to the accompanying drawings and embodiments.

One of the most outstanding technical advantages of AMOLED display technology is that it is easy to fabricate flexible device. The inventors have found that in a flexible AMOLED display device, when a light emitting display unit and a light emitting control unit are integrated, crosstalk usually occurs between display light and control light, reducing the display quality.

In view of the above-mentioned drawbacks or deficiencies in the prior art, it is desired to provide a flexible OLED display device and a fabricating method thereof to reduce crosstalk between display light and control light.

Figure 1:
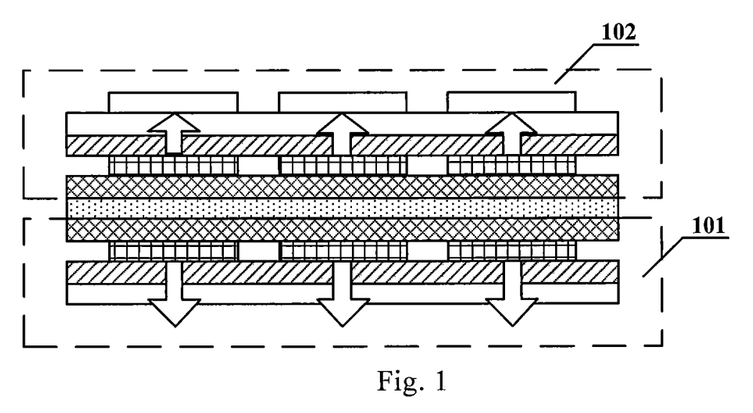
FIG. 1 is a schematic structural diagram of a flexible OLED display device according to an embodiment of the present disclosure.
Figure 2:
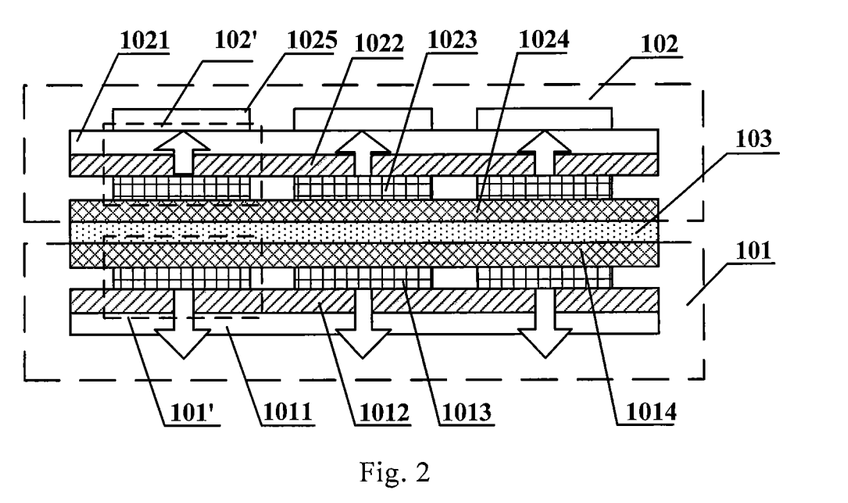
FIG. 2 is a schematic structural diagram of a flexible OLED display device according to an embodiment of the present disclosure.

Referring to FIG. 1 and FIG. 2, a flexible OLED display device according to an embodiment of the present disclosure includes: a light emitting display unit 101 for realizing a display function and a controllable deformation unit 102 being capable of deforming under illumination. The light emitting display unit 101 includes a display light emitting device 101'; the controllable deformation unit 102 includes a control light emitting device 102' and a photo-deformable layer 1025 disposed in a light emitting direction of the control light emitting device. The photo-deformable layer 1025 is capable of deforming under illumination of the control light emitting device 102'. An optical path of the control light emitting device 102' (shown by an upward arrow in FIG. 2) and an optical path of the display light emitting device 101' (shown by a downward arrow in FIG. 2) do not coincide with each other.

In FIG. 1 and FIG. 2, the light emitting display unit 101 emits light downward, and the controllable deformation unit 102 emits light upward. Since the optical path of the control light emitting device and the optical path of the display light emitting device do not coincide with each other, crosstalk between display light and control light is prevented, and the display quality is improved.

The light emitting display unit 101 for realizing the display function and the controllable deformation unit 102 being capable of deforming under illumination can be formed separately and then encapsulated together. The light emitting display unit 101 for realizing the display function and the controllable deformation unit 102 being capable of deforming under illumination can also be formed simultaneously by sharing a transparent flexible substrate and a sealant.

When the light emitting display unit 101 and the controllable deformation unit 102 are formed separately, in some embodiments, as shown in FIG. 2, the flexible display panel further includes an encapsulation layer 103 between the light emitting display unit 101 and the controllable deformation unit 102. The display light emitting device 101' includes: a first transparent flexible substrate 1011; a first reflective cathode 1014, a display light emitting layer 1013 and a first transparent anode 1012 disposed in sequence between the first transparent flexible substrate 1011 and the encapsulation layer 103 along a light emitting direction of display light. The control light emitting device 102' includes: a second transparent flexible substrate 1021; a second reflective cathode 1024, a control light emitting layer 1023 and a second transparent anode disposed in sequence between the second transparent flexible substrate 1021 and the encapsulation layer 103 along a light emitting direction of control light. The first reflective cathode 1014 and the second reflective cathode 1024 share the encapsulation layer for encapsulation connection.

Those skilled in the art can understand that a TFT (thin film transistor) can be disposed on the first transparent flexible substrate 1011 and the second transparent flexible substrate 1021 to control the display light emitting device 101' and the control light emitting device 102'.

In this case, the light emitting display unit 101 can also be realized by other structures as long as it is a flexible display panel capable of realizing deformation, such as a flexible LCD, a flexible electronic paper, a flexible micro display.

In some embodiments, the light emitting display unit 101 and the controllable deformation unit 102 are disposed on a same side of the transparent flexible substrate. In this case, the light emitting display unit 101 and the controllable deformation unit 102 share a transparent flexible substrate and a sealant.

Figure 3:
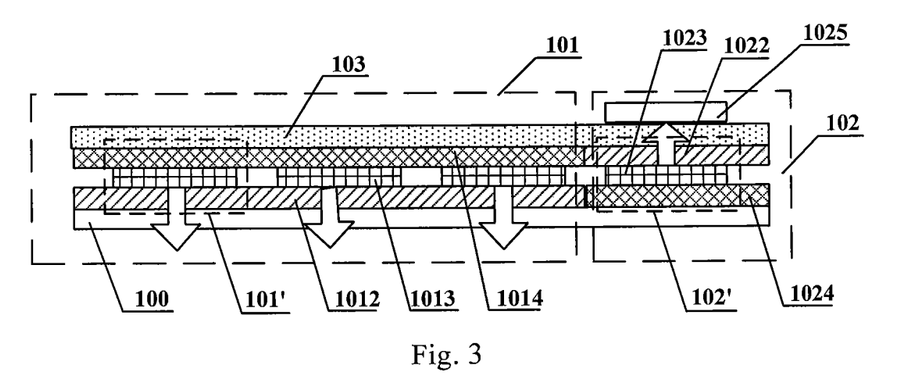
FIG. 3 is a schematic structural diagram of a flexible OLED display device according to an embodiment of the present disclosure.

In some embodiments, as shown in FIG. 3, the flexible display panel further includes a transparent flexible substrate 100 and an encapsulation layer 103. The display light emitting device 101' includes a first reflective cathode 1014, a display light emitting layer 1013 and a first transparent anode 1012 disposed in sequence between the transparent flexible substrate 100 and the encapsulation layer 103 along a light emitting direction of display light. The control light emitting device 102' includes a second reflective cathode 1024, a control light emitting layer 1023 and a second transparent anode 1022 disposed in sequence between the transparent flexible substrate 100 and the encapsulating layer 103 along a light emitting direction of control light. The light emitting display units and the controllable deformation units 102 are arrayed in an array and share the transparent flexible substrate 100 and the encapsulation layer 103. The first transparent anode 1012 and the second reflective cathode 1024 are located in a same layer. The display light emitting layer 1013 and the control light emitting layer 1023 are located in a same layer. The first reflective cathode 1014 and the second transparent anode 1022 are located in a same layer.

In the context of the present disclosure, "elements located in a same layer" means that these elements are layered and distributed at substantially the same height.

Figure 4:
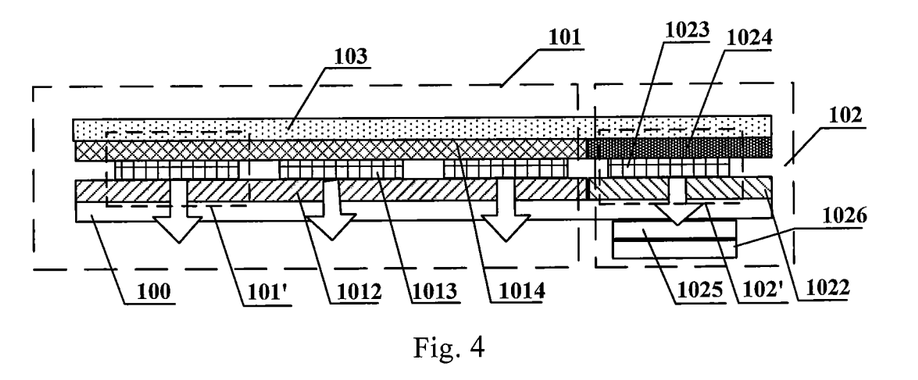
FIG. 4 is a schematic structural diagram of a flexible OLED display device according to an embodiment of the present disclosure.

In some embodiments, as shown in FIG. 4, the flexible display panel further includes a transparent flexible substrate 100 and an encapsulation layer 103. The display light emitting device 101' includes a first reflective cathode 1014, a display light emitting layer 1013 and a first transparent anode 1012 disposed in sequence between the transparent flexible substrate 100 and the encapsulation layer 103 along a light emitting direction of display light. The control light emitting device 102' includes a second reflective cathode 1024, a control light emitting layer 1023 and a second transparent anode 1022 disposed in sequence between the transparent flexible substrate 100 and the encapsulating layer 103 along a light emitting direction of control light. The light emitting display units and the controllable deformation units 102 are arrayed in an array and share the transparent flexible substrate 100 and the encapsulation layer 103. The first transparent anode 1012 and the second transparent anode 1022 are located in a same layer. The display light emitting layer 1013 and the control light emitting layer 1023 are located in a same layer. The first reflective cathode 1014 and the second reflective cathode 1024 are located in a same layer.

In this embodiment, the display light emitting device 101' and the control light emitting device 102' are stacked in a same order. Therefore, with the arrangement as shown in FIG. 4, the display light emitting device 101' and the control light emitting device 102' can be simultaneously formed, which further simplifies the fabrication process. Optionally, to prevent control light from affecting the display effect, as shown in FIG. 4, a light shielding layer 1026 may be disposed on a side of the photo-deformable layer 1025 facing away from the transparent flexible substrate 100.

Figure 5:
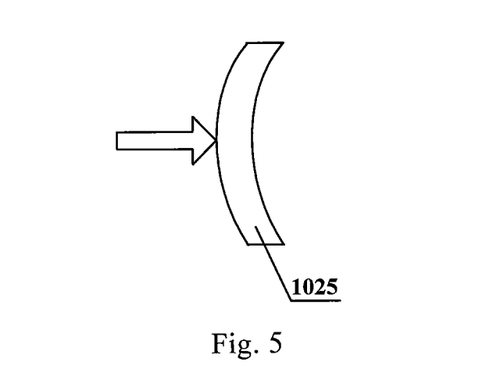
FIG. 5 is a schematic diagram of a deformation principle of a photo-deformable layer according to an embodiment of the present disclosure.

As shown in FIG. 5, the photo-deformable layer 1025 can be bent at a certain angle under the excitation of blue light. When blue light is removed, the photo-deformable layer 1025 can quickly recover its shape. By distributing a large amount of photo-deformable material in lateral and longitudinal directions, it is possible to control the deformation by the input electrical signal to achieve a desired shape for the display.

Figure 6:
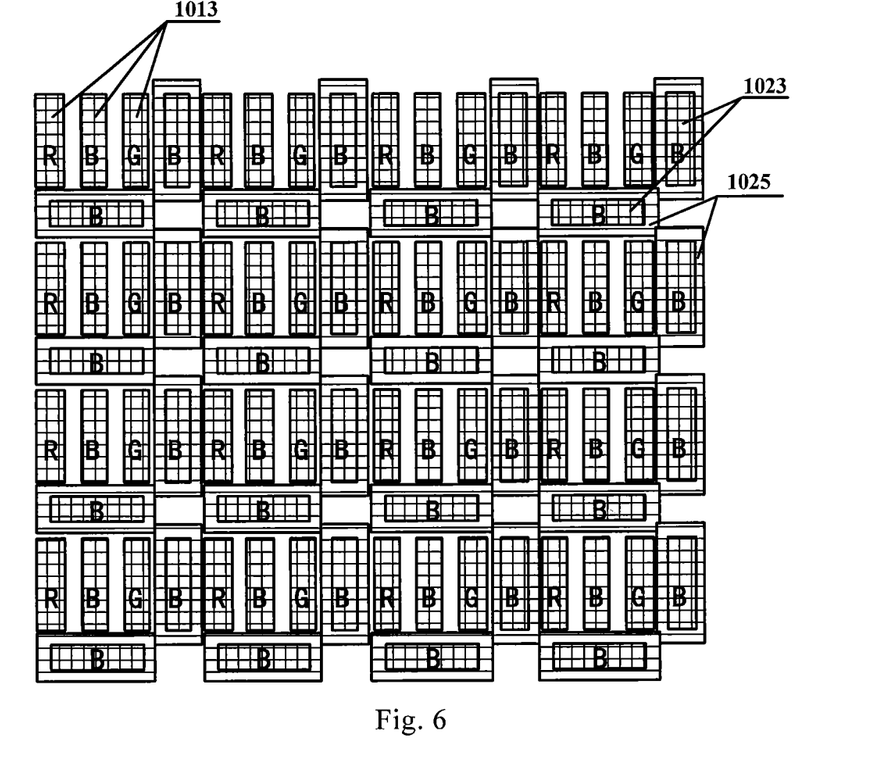
FIG. 6 is a top view of a flexible OLED display device according to an embodiment of the present disclosure.

The photo-deformable layer 1025 includes patterns of photo-deformable material arranged in an array, as shown in FIG. 6. The shape of each pattern of the photo-deformable material may be a strip, a grid or a plane, as long as it has a photo-deformable material sufficient to cause a desired deformation in both the lateral direction and the longitudinal direction.

The transparent flexible substrate 100, the first transparent flexible substrate 1011 and the second transparent flexible substrate 1021 may be made of any transparent material having flexibility, and may be fabricated by a semiconductor mask process. For example, polyimide polymer, polycarbonate polymer, polyether sulfone polymer or polyethylene terephthalate polymer may be used for the transparent flexible substrate 100, the first transparent flexible substrate 1011 and the second transparent flexible substrate 1021.

The first transparent anode and the second transparent anode may be selected from materials having high conductivity and high work function, and may be fabricated by a magnetron sputtering process. For example, ITO (indium tin oxide) or ATO (aluminum-doped tin oxide) may be used for the first transparent anode and the second transparent anode.

In some embodiments, the display light emitting layer includes a red light emitting layer, a green light emitting layer and a blue light emitting layer arranged in sequence. The control light emitting layer includes a blue light emitting layer.

In some embodiments, any one of the red light emitting layer, the green light emitting layer and the blue light emitting layer includes at least one or more of a hole injection layer HIL, a hole transport layer HTL, a light emitting layer EML, an electron transport layer ETL, and an electron injection layer EIL. The red light emitting layer, the green light emitting layer and the blue light emitting layer may be formed by a process such as vacuum evaporation, inkjet printing depending on material characteristics.

Figure 7:
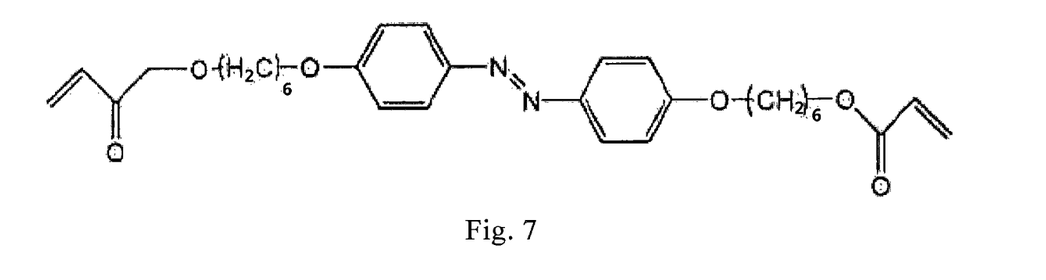
FIG. 7 is a molecular formula of a photo-deformable material according to an embodiment of the present disclosure.

In some embodiments, the photo-deformable layer may be a high cross-linked LCE (liquid crystal elastomer) film containing azobenzene. The photo-deformable layer may be formed by a process such as spin coating. The molecular formula of LCE containing azobenzene with a high degree of cross-linking is shown in FIG. 7.

The first reflective cathode and the second reflective cathode may be made of a material having a high electrical conductivity and a low work function, such as aluminum or aluminum-silver alloy, which may be formed by high-temperature vacuum evaporation.

The encapsulation layer 103 may be a $SiN_X$ or SiCN transparent film and can be fabricated by a CVD (chemical vapor deposition) process.

Figure 8:
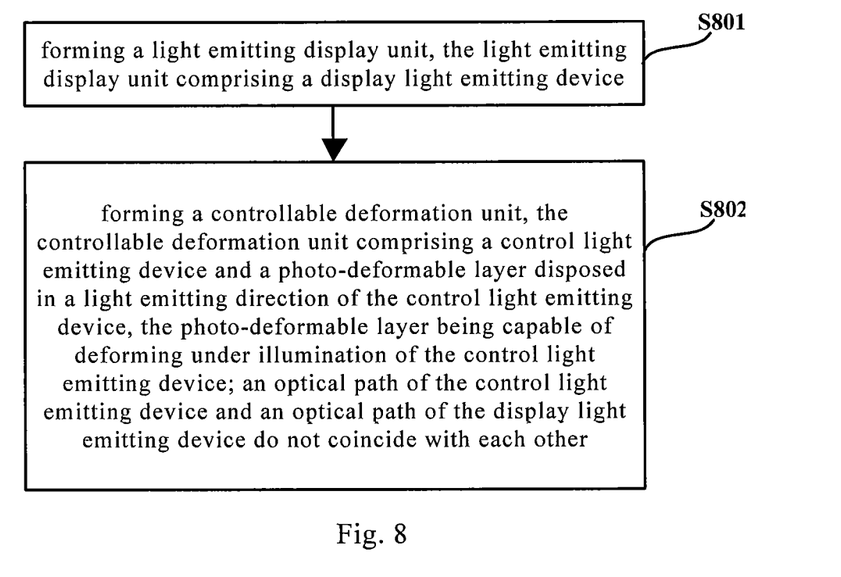
FIG. 8 is a flowchart of a method for fabricating a flexible OLED display device according to an embodiment of the present disclosure.

Embodiments of the present disclosure also provide a method for fabricating a flexible OLED display device. As shown in FIG. 8, the method includes the following steps.

Step S801, forming a light emitting display unit including a display light emitting device; and Step S802, forming a controllable deformation unit including a control light emitting device and a photo-deformable layer disposed in a light emitting direction of the control light emitting device, the photo-deformable layer being capable of deforming under illumination of the control light emitting device. An optical path of the control light emitting device and an optical path of the display light emitting device do not coincide with each other.

The order of forming the light emitting display unit and forming the controllable deformation unit may be interchanged.

Figure 9:
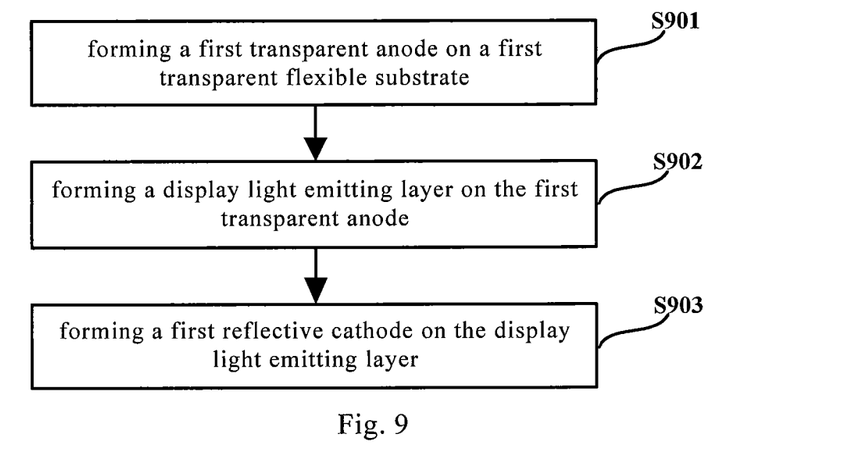
FIG. 9 is a flowchart of a method for fabricating a light emitting display unit according to an embodiment of the present disclosure.

Further, as shown in FIG. 9, the step of forming the light emitting display unit for realizing the display function includes: Step S901, forming a first transparent anode on a first transparent flexible substrate; Step S902, forming a display light emitting layer on the first transparent anode; and Step S903, forming a first reflective cathode on the display light emitting layer.

Figure 10:
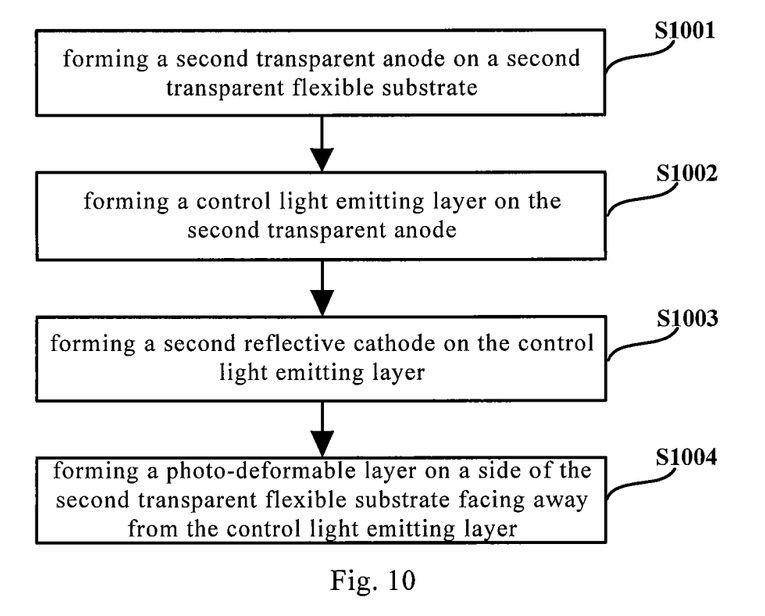
FIG. 10 is a flowchart of a method for fabricating a controllable deformation unit according to an embodiment of the present disclosure.

As shown in FIG. 10, the step of forming a controllable deformation unit for deforming by illumination includes: Step S1001, forming a second transparent anode on a second transparent flexible substrate; Step S1002, forming a control light emitting layer on the second transparent anode; Step S1003, forming a second reflective cathode on the control light emitting layer; and Step S1004, forming a photo-deformable layer on a side of the second transparent flexible substrate facing away from the control light emitting layer.

The step S1004 may also be performed before step S1003 or step S1002.

Figure 11:
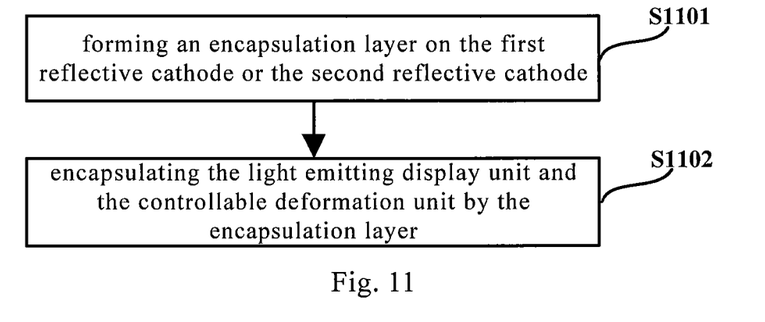
FIG. 11 is a flowchart of a method for encapsulating a light emitting display unit and a controllable deformation unit according to an embodiment of the present disclosure.

As shown in FIG. 11, the step of the encapsulating light emitting display unit and the controllable deformation unit includes: Step S1101, forming an encapsulation layer on the first reflective cathode or the second reflective cathode; and Step S1102, encapsulating the light emitting display unit and the controllable deformation unit by the encapsulation layer.

The encapsulated first reflective cathode and second reflective cathode are connected by the encapsulation layer.

Figure 12:
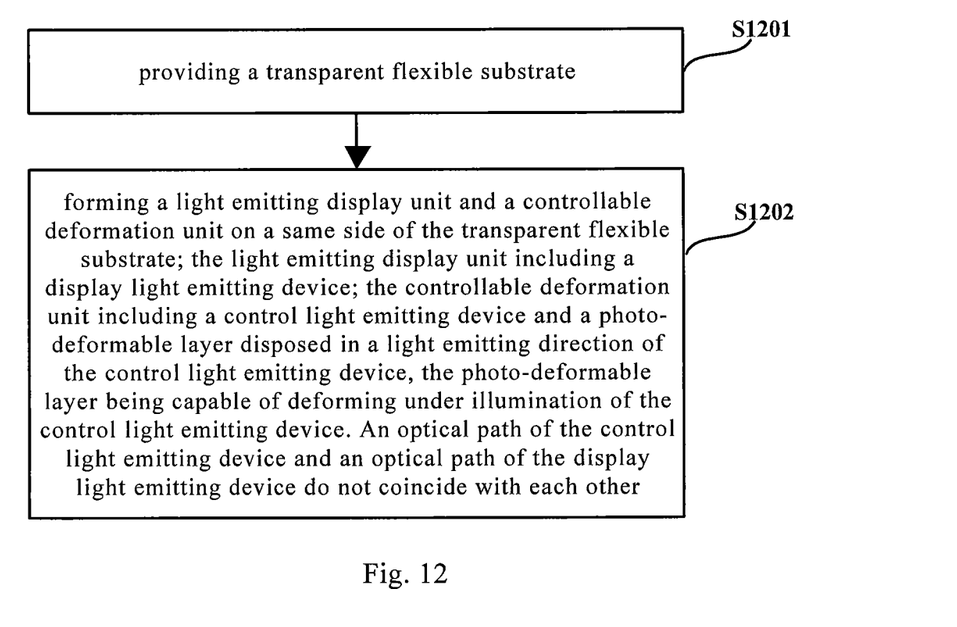
FIG. 12 is a flowchart of a method for fabricating a flexible OLED display device according to an embodiment of the present disclosure.

An embodiment of the present disclosure also provides a method for fabricating a flexible OLED display device. As shown in FIG. 12, the method includes: Step S1201, providing a transparent flexible substrate; and Step S1202, forming a light emitting display unit and a controllable deformation unit on a same side of the transparent flexible substrate; the light emitting display unit including a display light emitting device; the controllable deformation unit including a control light emitting device and a photo-deformable layer disposed in a light emitting direction of the control light emitting device, the photo-deformable layer being capable of deforming under illumination of the control light emitting device. An optical path of the control light emitting device and an optical path of the display light emitting device do not coincide with each other.

In some embodiments, as shown in FIG. 3, the step of forming the light emitting display unit and the controllable deformation unit on the transparent flexible substrate includes: forming a first transparent anode of the light emitting display unit and a second reflective cathode of the controllable deformation unit on a same side of the transparent flexible substrate, the first transparent anode and the second reflective cathode being located in a same layer; forming a display light emitting layer of the light emitting display unit on the first transparent anode, forming a control light emitting layer of the controllable deformation unit on the second reflective cathode, the display light emitting layer and the control light emitting layer being located in a same layer; forming a first reflective cathode of the light emitting display unit on the display light emitting layer, forming a second transparent anode of the controllable deformation unit on the control light emitting layer, the first reflective cathode and the second transparent anode being located in a same layer; forming an encapsulation layer on the first reflective cathode and the second transparent anode; and forming a photo-deformable layer on the encapsulation layer.

In some embodiments, as shown in FIG. 4, the step of forming a light emitting display unit for realizing a display function and forming a controllable deformation unit for deforming by illumination on the transparent flexible substrate includes: forming a first transparent anode of the light emitting display unit and a second transparent anode of the controllable deformation unit on a same side of the transparent flexible substrate, the first transparent anode and the second transparent anode being located in a same layer; forming a display light emitting layer of the light emitting display unit on the first transparent anode, forming a control light emitting layer of the controllable deformation unit on the second transparent anode, the display light emitting layer and the control light emitting layer being located in a same layer; forming a first reflective cathode of the light emitting display unit on the display light emitting layer, forming a second reflective cathode of the controllable deformation unit on the control light emitting layer, the first reflective cathode and the second reflective cathode being located in a same layer; forming an encapsulation layer on the first reflective cathode and the second reflective cathode; and forming a photo-deformable layer on the transparent flexible substrate.

In this embodiment, the display light emitting device 101' and the control light emitting device 102' are stacked in a same order. Therefore, with the arrangement as shown in FIG. 4, the display light emitting device 101' and the control light emitting device 102' can be simultaneously formed, which further simplifies the fabrication process.

In some embodiments, as shown in FIG. 4, the method further includes disposing a light shielding layer on a side of the photo-deformable layer facing away from the transparent flexible substrate. Optionally, to prevent control light from affecting the display effect, as shown in FIG. 4, a light shielding layer 1026 may be disposed on a side of the photo-deformable layer 1025 facing away from the transparent flexible substrate 100.

If deformation is required in only one direction, the photo-deformable layer can be coated over the entire surface. If deformation in both directions is required, it is necessary to arrange an array of controllable deformation units which are laterally deformable and controllable deformation units which are longitudinally deformable, as shown in FIG. 6.

It should be noted that although the operations of the methods are described in a particular order in the figures, this is not required or implied that the operations must be performed in that particular order, or that all of the operations shown must be performed to achieve the desired results. Instead, the order of execution of the steps depicted in the flowcharts can be changed. Additionally or alternatively, certain steps may be omitted, multiple steps may be combined into one step, and/or one step may be broke down into multiple steps.

Embodiments of the present disclosure further provide a flexible OLED display apparatus, which includes the flexible OLED display device provided by the embodiments of the present disclosure.

The above embodiments are only used for explanations rather than limitations to the present disclosure, the ordinary skilled person in the related technical field, in the case of not departing from the spirit and scope of the present disclosure, may also make various modifications and variations, therefore, all the equivalent solutions also belong to the scope of the present disclosure, the patent protection scope of the present disclosure should be defined by the claims.

The invention claimed is:
1. A flexible display panel, comprising:
 a light emitting display unit comprising a display light emitting device; and
 a controllable deformation unit comprising a control light emitting device and a photo-deformable layer in a light emitting direction of the control light emitting device,
 wherein the photo-deformable layer is configured to deform under illumination of the control light emitting device; and
 wherein an optical path of the control light emitting device and an optical path of the display light emitting device do not coincide with each other.

2. The flexible display panel of claim 1, further comprising:
 an encapsulation layer between the light emitting display unit and the controllable deformation unit;
 wherein the display light emitting device comprises a first transparent flexible substrate,
 wherein a first reflective cathode, a display light emitting layer, and a first transparent anode are in sequence between the first transparent flexible substrate and the encapsulation layer along a light emitting direction of display light,
 wherein the control light emitting device comprises a second transparent flexible substrate,
 wherein a second reflective cathode, a control light emitting layer, and a second transparent anode are in sequence between the second transparent flexible substrate and the encapsulation layer along a light emitting direction of control light; and
 wherein the first reflective cathode and the second reflective cathode share the encapsulation layer for encapsulation connection.

3. The flexible display panel of claim 1, further comprising:
 a transparent flexible substrate; and
 an encapsulation layer,
 wherein the display light emitting device comprises a first reflective cathode,
 wherein a display light emitting layer and a first transparent anode are in sequence between the transparent flexible substrate and the encapsulation layer along a light emitting direction of display light,
 wherein the control light emitting device comprises a second reflective cathode,
 wherein a control light emitting layer, and a second transparent anode are in sequence between the transparent flexible substrate and the encapsulation layer along a light exiting direction of control light,
 wherein a plurality of light emitting display units comprising the light emitting display unit and a plurality of controllable deformation units comprising the controllable deformation unit are arranged in an array and share the transparent flexible substrate and the encapsulation layer, wherein the first transparent anode and the second reflective cathode are in a same first layer, wherein the display light emitting layer and the control light emitting layer are in a same second layer, and wherein the first reflective cathode and the second transparent anode are in a same third layer.

4. The flexible display panel of claim 1, further comprising:

a transparent flexible substrate; and an encapsulation layer, wherein the display light emitting device comprises a first reflective cathode, wherein a display light emitting layer, and a first transparent anode are in sequence between the transparent flexible substrate and the encapsulation layer along a light emitting direction of display light, wherein the control light emitting device comprises a second reflective cathode, wherein a control light emitting layer, and a second transparent anode are in sequence between the transparent flexible substrate and the encapsulation layer along a light exiting direction of control light, wherein a plurality of light emitting display units comprising the light emitting display unit and a plurality of controllable deformation units comprising the controllable deformation unit are arranged in an array and share the transparent flexible substrate and the encapsulation layer, wherein the first transparent anode and the second transparent anode are in a same first layer;

wherein the display light emitting layer and the control light emitting layer are in a same second layer;

wherein the first reflective cathode and the second reflective cathode are in a same third layer.

5. The flexible display panel of claim 2, wherein the display light emitting layer comprises:

a red light emitting layer, a green light emitting layer, and a blue light emitting layer arranged in sequence;

wherein the control light emitting layer comprises a blue light emitting layer.

6. The flexible display panel of claim 5, wherein at least one of the red light emitting layer, the green light emitting layer, or the blue light emitting layer comprises at least one of a hole injection layer HIL, a hole transport layer HTL, a light emitting layer EML, an electron transport layer ETL, or an electron injection layer EIL.

7. The flexible display panel of claim 5, wherein the photo-deformable layer comprises a high cross-linked liquid crystal elastomer (LCE) film comprising azobenzene.

8. The flexible display panel of claim 2, wherein the photo-deformable layer comprises patterns of a photo-deformable material arranged in an array, wherein a shape of each pattern of the patterns of the photo-deformable material is a strip, a grid or a plane.

9. A method for fabricating a flexible display panel, comprising:

forming a light emitting display unit by forming a display light emitting device; and forming a controllable deformation unit by forming a control light emitting device and a photo-deformable layer in a light emitting direction of the control light emitting device, wherein the photo-deformable layer is configured to deform under illumination of the control light emitting device, and wherein an optical path of the control light emitting device and an optical path of the display light emitting device do not coincide with each other.

10. The method of claim 9, wherein forming the light emitting display unit comprises:

forming a first transparent anode on a first transparent flexible substrate;

forming a display light emitting layer on the first transparent anode; and forming a first reflective cathode on the display light emitting layer, wherein the forming the controllable deformation unit comprises:

forming a second transparent anode on a second transparent flexible substrate;

forming a control light emitting layer on the second transparent anode;

forming a second reflective cathode on the control light emitting layer; and forming the photo-deformable layer on a side of the second transparent flexible substrate facing away from the control light emitting layer;

forming an encapsulation layer on the first reflective cathode or the second reflective cathode; and encapsulating the light emitting display unit and the controllable deformation unit by the encapsulation layer.

11. A method for fabricating a flexible display panel, comprising:

providing a transparent flexible substrate; and forming a light emitting display unit by forming a display light emitting device, and forming a controllable deformation unit on a same side of the transparent flexible substrate by forming a control light emitting device and a photo-deformable layer in a light emitting direction of the control light emitting device, wherein the photo-deformable layer is configured to deform under illumination of the control light emitting device, and wherein an optical path of the control light emitting device and an optical path of the display light emitting device do not coincide with each other.

12. The method of claim 11, wherein the forming the light emitting display unit comprises:

forming a first transparent anode of the light emitting display unit and a second reflective cathode of the controllable deformation unit on a same side of the transparent flexible substrate, wherein the first transparent anode and the second reflective cathode are in a same first layer;

forming a display light emitting layer of the light emitting display unit on the first transparent anode, and forming a control light emitting layer of the controllable deformation unit on the second reflective cathode, wherein the display light emitting layer and the control light emitting layer are in a same second layer;

forming a first reflective cathode of the light emitting display unit on the display light emitting layer, and forming a second transparent anode of the controllable deformation unit on the control light emitting layer, wherein the first reflective cathode and the second transparent anode are in a same third layer;

forming an encapsulation layer on the first reflective cathode and the second transparent anode; and forming the photo-deformable layer on the encapsulation layer.

13. The method of claim 11, wherein the forming the light emitting display unit comprises:
   forming a first transparent anode of the light emitting display unit and a second transparent anode of the controllable deformation unit on a same side of the transparent flexible substrate, wherein the first transparent anode and the second transparent anode are in a same first layer;
   forming a display light emitting layer of the light emitting display unit on the first transparent anode, and forming a control light emitting layer of the controllable deformation unit on the second transparent anode, wherein the display light emitting layer and the control light emitting layer are in a same second layer;
   forming a first reflective cathode of the light emitting display unit on the display light emitting layer, and forming a second reflective cathode of the controllable deformation unit on the control light emitting layer, wherein the first reflective cathode and the second reflective cathode are in a same third layer;
   forming an encapsulation layer on the first reflective cathode and the second reflective cathode; and
   forming the photo-deformable layer on the transparent flexible substrate.

14. The method of claim 13, further comprising:
   disposing a light shielding layer on a side of the photo-deformable layer facing away from the transparent flexible substrate.

15. A flexible display apparatus, comprising the flexible display panel of claim 1.

16. The flexible display apparatus of claim 15, further comprising:
   an encapsulation layer between the light emitting display unit and the controllable deformation unit,
   wherein the display light emitting device comprises a first transparent flexible substrate,
   wherein a first reflective cathode, a display light emitting layer, and a first transparent anode are in sequence between the first transparent flexible substrate and the encapsulation layer along a light emitting direction of display light,
   wherein the control light emitting device comprises a second transparent flexible substrate,
   wherein a second reflective cathode, a control light emitting layer, and a second transparent anode are in sequence between the second transparent flexible substrate and the encapsulation layer along a light emitting direction of control light, and
   wherein the first reflective cathode and the second reflective cathode share the encapsulation layer for encapsulation connection.

17. The flexible display apparatus of claim 15, further comprising:
   a transparent flexible substrate; and
   an encapsulation layer,
   wherein the display light emitting device comprises a first reflective cathode,
   wherein a display light emitting layer, and a first transparent anode are in sequence between the transparent flexible substrate and the encapsulation layer along a light emitting direction of display light,
   wherein the control light emitting device comprises a second reflective cathode,
   wherein a control light emitting layer, and a second transparent anode are in sequence between the transparent flexible substrate and the encapsulation layer along a light exiting direction of control light;
   wherein a plurality of light emitting display units comprising the light emitting display unit and a plurality of controllable deformation units comprising the controllable deformation unit are arranged in an array and share the transparent flexible substrate and the encapsulation layer,
   wherein the first transparent anode and the second reflective cathode are in a same first layer,
   wherein the display light emitting layer and the control light emitting layer are in a same second layer, and
   wherein the first reflective cathode and the second transparent anode are in a same third layer.

18. The flexible display apparatus of claim 15, further comprising:
   a transparent flexible substrate; and
   an encapsulation layer,
   wherein the display light emitting device comprises a first reflective cathode,
   wherein a display light emitting layer, and a first transparent anode are in sequence between the transparent flexible substrate and the encapsulation layer along a light emitting direction of display light,
   wherein the control light emitting device comprises a second reflective cathode,
   wherein a control light emitting layer and a second transparent anode are in sequence between the transparent flexible substrate and the encapsulation layer along a light exiting direction of control light,
   wherein a plurality of light emitting display units comprising the light emitting display unit and a plurality of controllable deformation units comprising the controllable deformation unit are arranged in an array and share the transparent flexible substrate and the encapsulation layer,
   wherein the first transparent anode and the second transparent anode are in a same first layer,
   wherein the display light emitting layer and the control light emitting layer are in a same second layer, and
   wherein the first reflective cathode and the second reflective cathode are in a same third layer.

19. The flexible display apparatus of claim 16, wherein the display light emitting layer comprises:
   a red light emitting layer, a green light emitting layer, and a blue light emitting layer arranged in sequence,
   wherein the control light emitting layer comprises a blue light emitting layer.

20. The flexible display apparatus of claim 19, wherein at least one of the red light emitting layer, the green light emitting layer, or the blue light emitting layer comprises at least one or more of a hole injection layer HIL, a hole transport layer HTL, a light emitting layer EML, an electron transport layer ETL, or an electron injection layer EIL.

* * * * *

UNITED STATES PATENT AND TRADEMARK OFFICE
CERTIFICATE OF CORRECTION

PATENT NO. : 11,114,639 B2  
APPLICATION NO. : 16/466241  
DATED : September 7, 2021  
INVENTOR(S) : Zeng et al.

Page 1 of 1

It is certified that error appears in the above-identified patent and that said Letters Patent is hereby corrected as shown below:

On the Title Page (73) Assignees: Please correct "HEFEIXINSHENG" to read -- HEFEI XINSHENG --

Signed and Sealed this  
Twenty-eighth Day of December, 2021

Drew Hirshfeld  
*Performing the Functions and Duties of the*  
*Under Secretary of Commerce for Intellectual Property and*  
*Director of the United States Patent and Trademark Office*